(12) United States Patent
He

(10) Patent No.: US 7,970,032 B2
(45) Date of Patent: Jun. 28, 2011

(54) METHOD AND DEVICE FOR REDUCING LASER PHASE NOISE

(75) Inventor: Qing He, Lasalle (CA)

(73) Assignee: Sensilaser Technologies Inc., Lasalle (CA)

( * ) Notice: Subject to any disclaimer, the term of this patent is extended or adjusted under 35 U.S.C. 154(b) by 82 days.

(21) Appl. No.: 12/083,508

(22) PCT Filed: Oct. 12, 2006

(86) PCT No.: PCT/CA2006/001673
§ 371 (c)(1),
(2), (4) Date: Nov. 20, 2009

(87) PCT Pub. No.: WO2007/041852
PCT Pub. Date: Apr. 19, 2007

(65) Prior Publication Data
US 2010/0054288 A1    Mar. 4, 2010

Related U.S. Application Data

(60) Provisional application No. 60/725,665, filed on Oct. 13, 2005.

(51) Int. Cl.
*H01S 3/00* (2006.01)
(52) U.S. Cl. .................... 372/38.08; 356/486
(58) Field of Classification Search .............. 372/38.08, 372/38.01, 29.016, 29.011
See application file for complete search history.

(56) References Cited

U.S. PATENT DOCUMENTS

| | | | |
|---|---|---|---|
| 5,127,731 A * | 7/1992 | DeGroot | 356/486 |
| 5,732,169 A | 3/1998 | Riant et al. | |
| 6,058,131 A | 5/2000 | Pan | |
| 6,370,175 B1 * | 4/2002 | Ikeda et al. | 372/38.1 |
| 6,606,158 B2 * | 8/2003 | Rosenfeldt et al. | 356/477 |
| 6,915,084 B2 | 7/2005 | Ho et al. | |
| 7,200,339 B1 | 4/2007 | Roberts et al. | |
| 7,557,929 B2 * | 7/2009 | Fang-Yen et al. | 356/484 |

(Continued)

FOREIGN PATENT DOCUMENTS

EP    0479118 A2    4/1992

(Continued)

OTHER PUBLICATIONS

Pellegrino L.P. et al., "Bragg Grating Fabry-Perot Cavities at 10 GHz," 2005, pp. 101-102, Proceedings of the $5^{th}$ International Conference on Numerical simulation of Optoelectronics Devices.

(Continued)

*Primary Examiner* — Minsun Harvey
*Assistant Examiner* — Tuan N. Nguyen
(74) *Attorney, Agent, or Firm* — K&L Gates LLP

(57) ABSTRACT

The present invention relates to a method and device for reducing the phase noise of a laser signal from a laser source. This device comprises a first current generator for supplying a driving current to the laser source in view of producing the laser signal. A phase noise detector is responsive to the laser wavelength for generating a phase error signal and a second current generator is responsive to the phase error signal for generating a compensation current added to the driving current supplied to the laser source for generating a phase-adjusted laser signal. The device therefore defines a phase stabilization loop formed by the phase noise detector and the second current generator, for reducing the phase noise of the laser signal.

16 Claims, 8 Drawing Sheets

U.S. PATENT DOCUMENTS

| | | |
|---|---|---|
| 2003/0039276 A1 | 2/2003 | Tatsuno et al. |
| 2004/0033021 A1 | 2/2004 | Oguri et al. |
| 2005/0057756 A1* | 3/2005 | Fang-Yen et al. ............. 356/497 |

FOREIGN PATENT DOCUMENTS

| | | |
|---|---|---|
| GB | 2360628 A | 9/2001 |
| JP | 04157780 | 5/1992 |
| JP | 2003324241 | 11/2003 |
| WO | 9705679 | 2/1997 |
| WO | 0049690 | 8/2000 |

OTHER PUBLICATIONS

International Preliminary Report on Patentability for International Application No. PCT/CA2006/001673, date of completion Jan. 11, 2008, 6 pgs.

Supplementary European Search Report for EP Application No. 06 79 0829, date of completion of search Feb. 2, 2011, 2 pgs.4

* cited by examiner

METHOD AND DEVICE FOR REDUCING LASER PHASE NOISE

CROSS REFERENCE TO RELATED APPLICATIONS

This application is the U.S. National Phase Application of International Patent Application Serial No. PCT/CA06/001673, filed Oct. 12, 2006, published under PCT Article 21(2) in English, which claims priority to and the benefit under 35 U.S.C. Section 119(e) of U.S. Provisional Patent Application Ser. No. 60/725,665, filed Oct. 13, 2005, the entire disclosures of each of which are incorporated by reference herein.

FIELD OF THE INVENTION

The present invention relates generally to a method and device for reducing phase noise of a laser source. More specifically, but not exclusively, the present invention relates to a method and device for effectively reducing the phase noise by 20 to 40 dB in the low frequency range of conventional distributed feedback diode laser and gain chip based external cavity laser (ECL), etc. for, as an example, fiber optic sensors based on interferometric principles, RF signal generation and coherent communications.

BACKGROUND OF THE INVENTION

In oil and gas exploration industries, seismic survey is a technique for determining the detailed geographic structure underlying a particular area by propagating acoustic shock waves into the strata and detecting and measuring the reflected seismic wave signal. The seismic survey technology is now recognized as a crucial area for oil and gas exploration and production industries in order to increase capital efficiency, minimize the risks for capital investment, eliminate the dry holes and increase oil production throughput.

Fiber optic based seismic survey sensing technology improves penetration through salt domes by reaching beyond 10,000 feet in depth with a resolution of less than 50 feet. This improved performance helps to discover additional new oil or gas reserves.

The core components in a fiber optic seismic system are the low phase noise laser sources and sensitive seismic fiber optic sensors (e.g., accelerometers, hydrophones or geophones) based on interferometric principles. The laser sources need to show not only low phase noise, but also low sensitivity to external vibration disturbance due to harsh environment.

Conventional high power telecom grade diode lasers exhibit narrow linewidth and low sensitivity to vibrations due to its small size. These characteristics make them suitable for use as coherent light source for interferometer-based applications. But they exhibit high phase noise in the seismic sensors working frequency range, typically 1-1000 Hz. Other types of lasers such as optical fiber lasers exhibit low phase noise but their phase noise increases dramatically in the field environment due to the sensitivity of the optical fiber (fiber length to be exact) to acoustic or mechanical vibrations (causing jitter and wavelength drift), which makes their use difficult without isolating the optical fiber lasers from harsh environmental disturbances.

These technical challenges and difficulties may hinder further development of fiber optic seismic sensing systems. In order to fulfill the need of fiber optic seismic sensing functions, vibration insensitive low phase noise laser sources are needed.

Other applications, such as precision spectroscopic measurements, hydrophone sensors, LIDAR, RF signal generation, coherent communications may also require low phase noise laser sources.

Furthermore, due to the high wavelength density nature of fiber optic seismic sensing systems, there is still a need to design and manufacture laser sources capable of both wavelength tuning and self-calibration to provide sufficient wavelength accuracy.

SUMMARY OF THE INVENTION

Therefore, according to an aspect of the present invention there is provided a method for reducing a phase noise of a laser signal from a laser source. This method comprises generating a main driving current to be supplied to the laser source for producing the laser signal; detecting a phase noise in the laser signal; generating a phase error signal in response to the detected phase noise; and generating a compensation current in response to the error signal to be added to the main driving current supplied to the laser source for producing a phase-adjusted laser signal. The operations of detecting the phase noise in the laser signal, generating the phase error signal in response to the detected phase noise and generating the compensation current in response to the error signal define a phase stabilization loop for reducing the phase noise of the laser signal.

The present invention also relates to a device for reducing a phase noise of a laser signal from a laser source. The device comprises a first current generator, a phase noise detector and a second current generator. The first current generator supplies a main driving current to the laser source for producing the laser signal. The phase noise detector is responsive to the laser signal for generating a phase error signal. The second current generator is responsive to the phase error signal for generating a compensation current added to the main driving current supplied to the laser source for generating a phase-adjusted laser signal. The phase noise detector and the second current generator form a phase stabilization loop for reducing the phase noise of the laser signal.

The present invention is further concerned with a detector for detecting wavelength drifting of a laser signal, comprising a wavelength discrimination filter, a first photodetector and a second photodetector. The wavelength discrimination filter is supplied with the laser signal and is so configured as to reflect a portion of the laser signal and to transmit a portion of the laser signal. The first photodetector is connected to the wavelength discrimination filter for measuring the transmitted portion of the laser signal, and the second photodetector is connected to the wavelength discrimination filter for measuring the reflected portion of the laser signal. The wavelength discrimination filter is a periodic high slope wavelength discrimination filter, the periodic high slope wavelength discrimination filter is a Fabry-Perot filter and the Fabry-Perot filter is made of two Bragg gratings spaced apart by a gap and formed inside an optical fiber. Measurements of the transmitted and the reflected laser signal portions are usable for detecting the wavelength drifting of the laser signal. Each of the transmitted and reflected laser signal portions are laser reference signals for each other.

The foregoing and other objects, advantages and features of the present invention will become more apparent upon reading of the following non restrictive description of illustrative embodiments thereof, given by way of example only in connection with the accompanying drawings.

DETAILED DESCRIPTION

Laser phase noise at low frequency can be reduced by sending laser light into a high slope wavelength discrimination filter and convert wavelength drifting into intensity variation. By measuring the intensity variation with a photodiode and comparing the measured intensity variation with a laser reference intensity, a error signal is generated. Based on this error signal, a compensation current is generated and is then added to a laser source driving current. In this manner, the laser wavelength is locked within a bandwidth of the resulting laser phase stabilization loop. It is to be understood that depending on the polarity of the compensation current, the compensation current may increase or decrease the value of the laser source driving current.

Several elements are taken into account for designing the phase noise reduction loop and maximizing the loop performance.

First, the phase noise characteristics of telecommunication grade laser diodes are different from each vendor. The laser noise spectrum and tuning response with injection current need to be tested in order to tune the wavelength locking loop adequately.

Second, the wavelength locking loop stability should not be affected by the variation of laser power sent into the loop, therefore logarithm amplifiers are used to amplify the photodiode current and generate wavelength locking current.

Third, since the noise of wavelength discrimination filter will be transferred into wavelength locking loop. This noise could be caused by filter's instability due to external disturbance and by filter's polarization dependent response.

Figure 1:
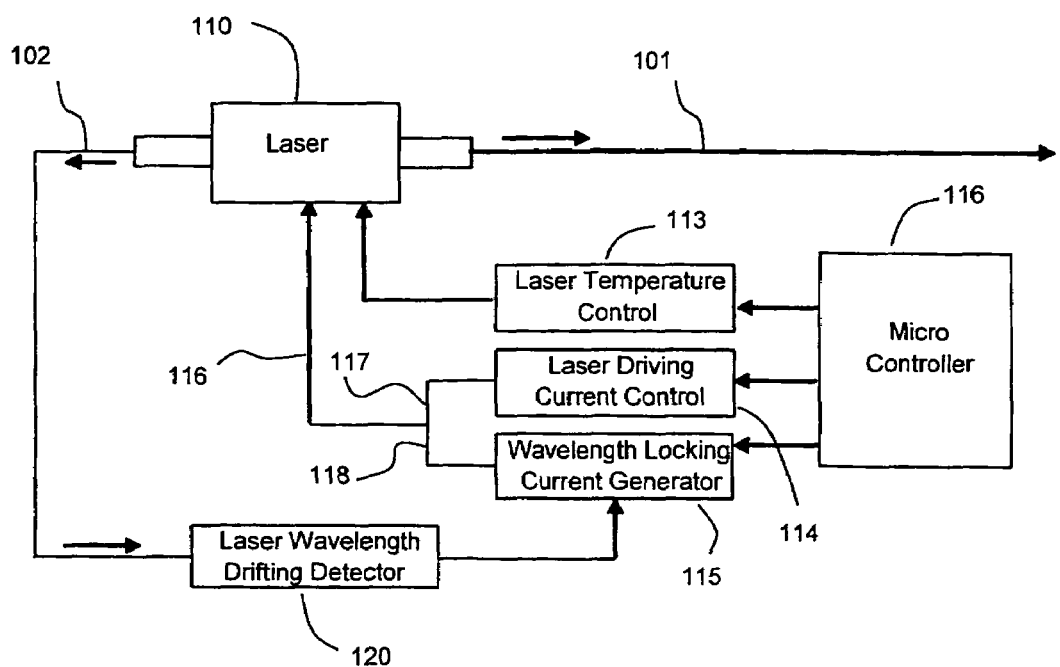
FIG. 1 is a block diagram of a laser phase noise reducing device comprising a laser current driving control, a laser temperature control, a wavelength drifting detector and a wavelength locking current generator.

FIG. 1 illustrates a functional block diagram showing a phase noise reduced laser source module according to a first non restrictive illustrative embodiment of the present invention.

The main driving current 117 of the laser 110 is supplied by a first current generator in the form of a laser driving current controller 114 and the operating temperature of the laser 110 is controlled by a temperature controller 113. Both the driving current controller 114 and temperature controller 113 are connected to a micro-controller 116. The main driving current 117 is a DC current with minimum variation.

The laser 110 has a first front output that emits a laser signal 101 and a second rear output that emits a laser signal 102. The laser signal 102 from the second rear output of the laser 110 is sent to a phase noise detector in the form of an optical wavelength drifting detection circuit 120. The electrical signal generated by this circuit 120 is supplied to a second current generator in the form of a laser wavelength locking current generator 115 which generates a relatively small compensation current 118 to be added to the main driving current 117 to yield a total driving current 116 supplied to the laser 110. The compensation current 118 therefore stabilizing the laser output wavelength 101 and reducing the phase noise of the laser 110.

In other words, the laser wavelength drifting detector 120 and the wavelength locking current generator 115 form a phase stabilization loop that reduces the phase noise of the laser signal 101.

Figure 2:
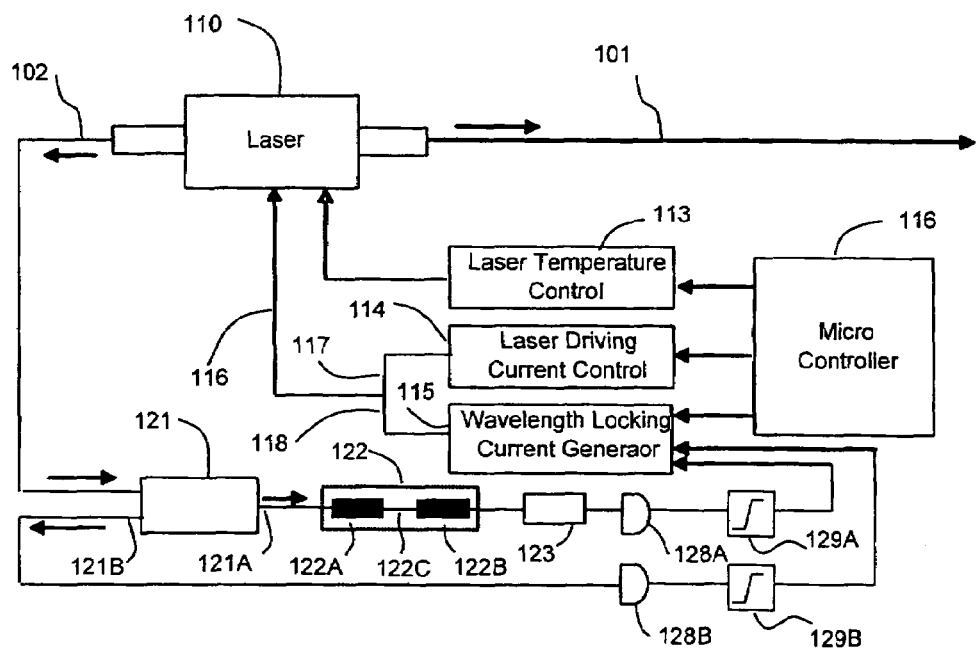
FIG. 2 is a block diagram of the laser phase noise reducing device, comprising an optical laser wavelength variation detector including a three-port fiber optic circulator, an in-line all-fiber Fabry-Perot cavity filter and two photodetectors.

FIG. 2 illustrates a functional block diagram showing in more detail the implementation of the phase stabilization loop of FIG. 1. The laser signal 102 collected from the second pigtailed output of the laser 110 is used as an input optical signal projected through a three-port circulator 121. The optical signal from the transmission port 121A passes through a reflective wavelength discrimination filter 122 and an attenuator 123 before reaching a first photo-detector in the form of a photodiode 128A. The optical signal from the reflective port 121B is directly routed into a second photo-detector in the form of a photodiode 128B. The attenuator 123 between the discrimination filter 122 and the photodiode 128A is used to compensate the additional insertion loss of the reflection port 121B of the circulator 121. Only at certain wavelengths the intensity of the power measured by both photo-diodes 128A and 128B can be equal, as will be described hereinbelow.

In the illustrative embodiment described herein, the laser 110 is a distributed feedback (DFB) laser diode packaged with both front and rear output pigtails using conventional diode packaging technologies. Alternatively, the laser 110 can also be an external cavity laser which consists of a diode gain chip and one or two fiber Bragg gratings to form the laser cavity.

The high frequency variation of the current at the output of both photodiode 128A and 128B is filtered out by respective low-pass filters 129A and 129B. The bandwidth of the low pass filters 129A and 129B determine the bandwidth of the phase stabilization loop bandwidth.

The reflective wavelength discrimination filter 122 is a filter which contains two sets of identical broadband chirped fiber Bragg gratings 122A and 122B formed in an optical fiber and spaced apart from each other by a gap 122C. Each set of gratings operates like a broadband reflector, and together operate as a Fabry-Perot cavity. The free spectral range (FSR) of the Fabry-Perot cavity depends on both the fiber index and the gap 122C.

The Fabry-Perot cavity is configured to have a very small FSR and a high contrast. A small FSR allows the locked laser wavelength to be very close to the initially set wavelength of the laser 110 and to improve the filter's sensibility to laser wavelength drifting.

As will easily be understood by one skilled in the art, the wavelength discrimination filter 122 reflects one portion of laser signal to the photodiode 128B and transmits another portion of the laser signal to the photodiode 128A.

Figure 3A:
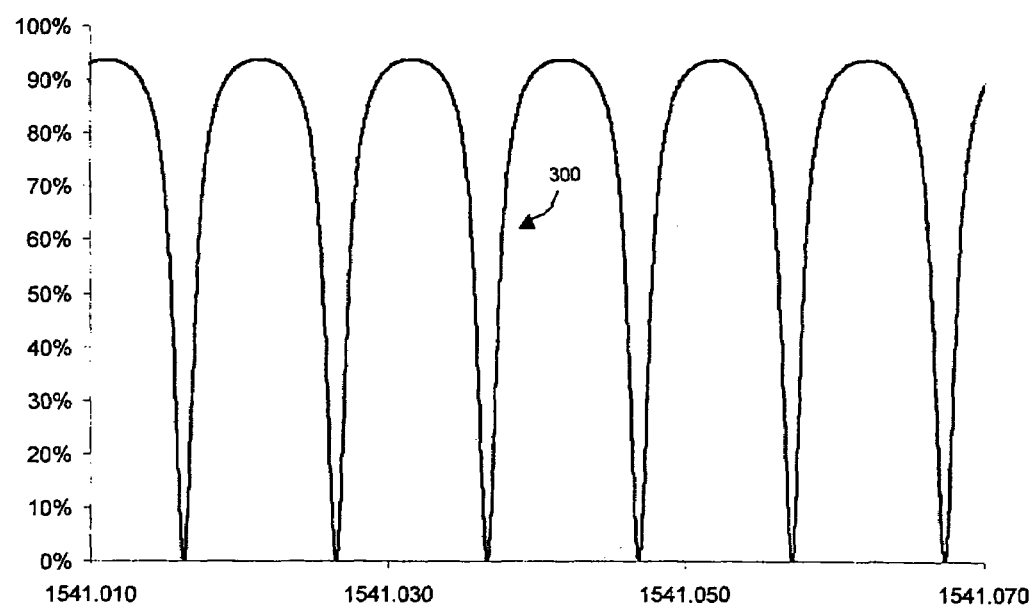
FIG. 3A is a portion of reflection spectrum of a fiber Fabry-Perot cavity filter formed by a set of two identical broadband chirped fiber Bragg gratings as shown in FIG. 2.
Figure 3B:
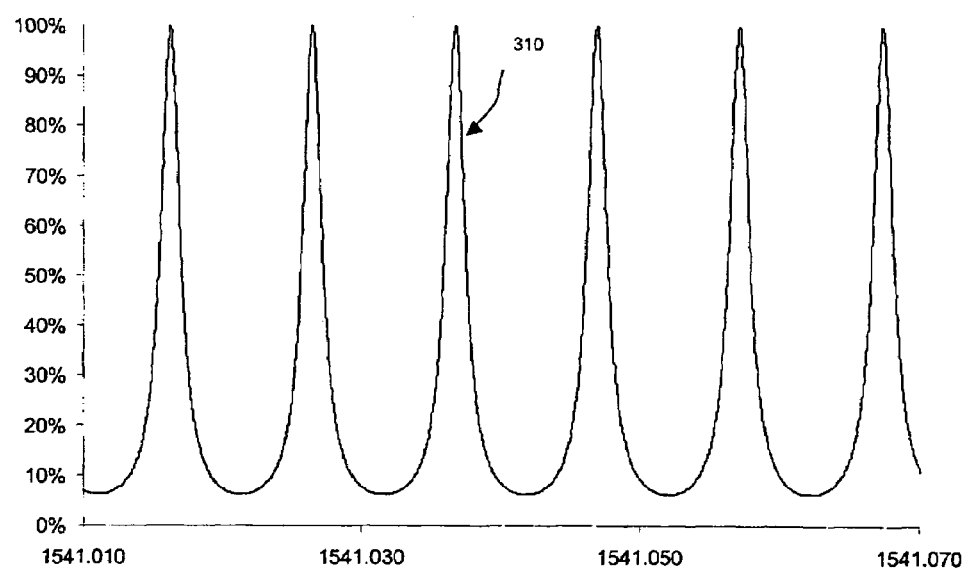
FIG. 3B is an example of transmission spectrum of a fiber Fabry-Perot filter formed by a set of two identical broadband chirped fiber Bragg gratings as shown in FIG. 2.

FIG. 3A and FIG. 3B show respectively, as an example, a portion of the reflection spectrum 300 and of the transmission spectrum 310 of an exemplary fiber Fabry-Perot cavity. The FSR is designed to be 10 picometers with maximum reflection about 90%. The reflection spectrum is detected by photodiode 128B and the transmission spectrum is detected by photodiode 128A.

Figure 3C:
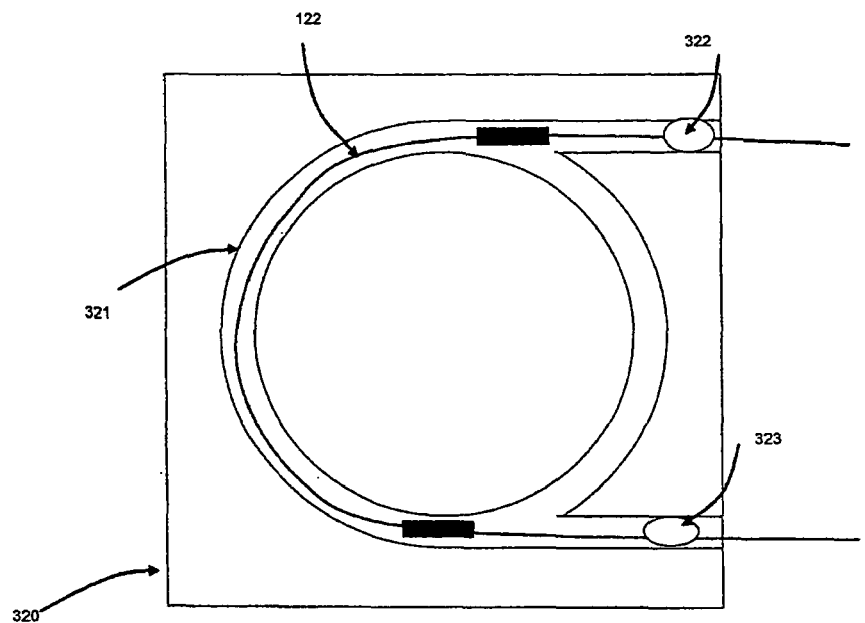
FIG. 3C is an example of a reduced vibration sensitivity fiber Fabry-Perot filter packaging design.

The fiber Bragg grating based reflective wavelength discrimination filter 122 is so packaged that its sensitivity to vibration is reduced to a level close to laser diode. FIG. 3C shows an illustrative example of the design of the package. The portion of the fiber containing the reflective wavelength discrimination filter 122 is inserted into a small size groove 321 inside a solid metal body 320 without any applied tension thereonto. The groove is filled with polymer similar fiber's coating material (not shown). The two apertures of the body 320 are filled with epoxy 322, 323, to adequately maintain the fiber therein. Accordingly, any strain applied on the fiber outside the body 320 will not be transferred to the fiber inside the body 320. Since the dimension of the body is quite small, vibration in low frequency range will not be effectively transferred to the fiber inside. The temperature stability of reflective wavelength discrimination filter 122 is controlled by the temperature control of the whole body 320 which sits on a thermoelectric cooler (not shown). The thermoelectric cooler control circuit is tuned to have low frequency response in order to minimize filter's high frequency noise.

Figure 3D:
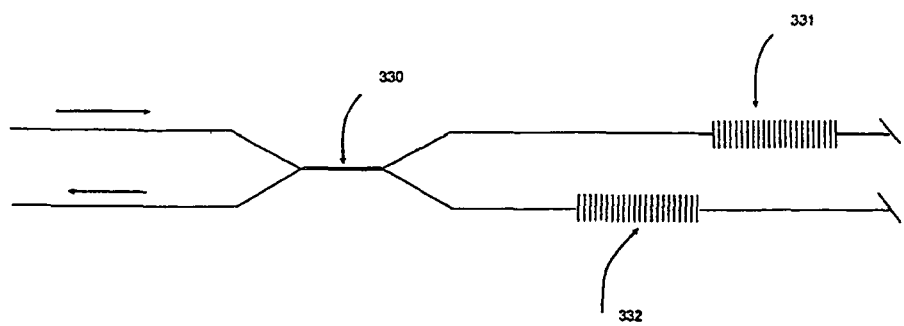
FIG. 3D is a schematic diagram of a high slope wavelength discrimination filter based on an all-fiber Michelson interferometer forming an alternative design for the fiber Fabry-Perot cavity filter of FIG. 2.

FIG. 3D shows a high slope wavelength discrimination filter that can be used as the reflective wavelength discrimination filter 122. Basically, it is a 3 dB fiber coupler 330 based asymmetric Michelson interferometer. Two identical broadband chirped fiber Bragg gratings 331, 332 are used as high reflectivity mirrors. The filter output in the wavelength domain is sinusoidal curve, its slope depend on position imbalance of fiber Bragg gratings 331, 332 on the two arms.

The reflective wavelength discrimination filter 122 and pigtailed photodiode 128A, 128B exhibit polarization dependent response which reduces the wavelength locking loop stability when the fiber is under vibration disturbance. Therefore, it is preferable that the second output of the laser 110 is connected to the circulator 121 via a polarization maintaining (PM) fiber pigtail. Similarly, the circulator 121 is pigtailed with PM fiber, the reflective wavelength discrimination filter 122 is PM fiber based and the photodiodes 128A, 128B are also connected by PM fiber pigtails.

Figure 4:
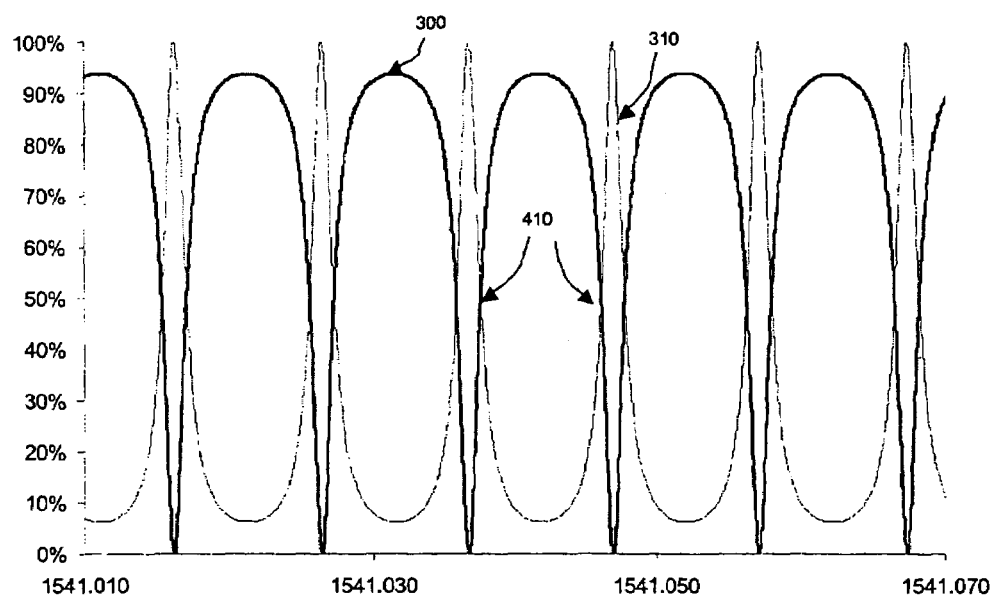
FIG. 4 is a typical optical normalized spectrum recorded simultaneously on both photodetectors of FIG. 2, wherein the cross points are used as wavelength references to lock the laser wavelength.

FIG. 4 shows an example of combined spectrum detected respectively by photodiode 128B and photodiode 128A. The crossing points 410 are used as reference wavelengths to lock the wavelength of the laser 110. So if the wavelength of the laser 110 doesn't match one of the reference wavelengths, the power detected by the photodiodes 128A and 128B will be not equal, and an error signal will be generated by the wavelength locking current generator 114. Indeed, as can be seen from FIG. 2, the output of the low-pass filters 129A and 129B are supplied to the wavelength locking current generator 115 that may calculate the error signal in the low frequency range.

The wavelength and power of the laser 110 can be initially set by the laser driving current control circuit 114 and laser temperature control circuit 113, but due to internal and external influence, the laser wavelength is not stabilized. Accordingly, the current detected by photodiodes 128A and 128B vary with time due to the drifting of the laser wavelength. By comparing the current signals generated by photodiode 128A and 128B through, for example, a comparator such as a differential amplifier (not shown), a small compensation current 118 is generated by the wavelength locking current generator 115 and then is added to the main driving current 117, whereby the real current 116 supplied to the laser 110 is increased or decreased depending on the polarity of the compensation signal 118. Once the current 116 is changed, the wavelength of the laser signal 101 from the laser 110 is adjusted accordingly. The circulator 121, the reflective wavelength discrimination filter 122, the attenuator 123, the photodiodes 128A, 128B, and the wavelength locking current generator circuit 115 form a phase stabilization loop which keeps the phase of the laser locked and stabilized to a closest reference wavelength defined by reflective wavelength discrimination filter 122; therefore the laser phase noise is reduced.

By detecting and comparing both transmitted and reflected laser signals instead of detecting only one of the transmitted and reflected laser signals and comparing it with a reference laser signal collected directly from the laser output, the sensitivity of the generated phase error signal to laser wavelength drifting is improved.

Figure 5:
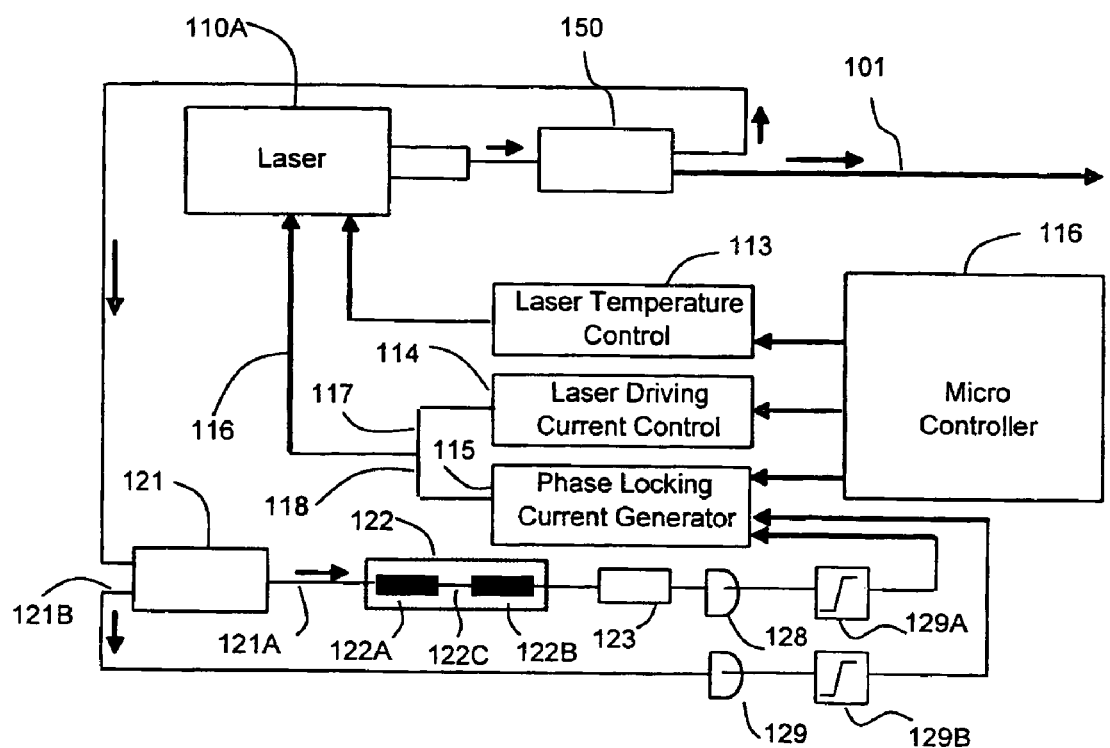
FIG. 5 is an alternative design using a fiber tap coupler at the laser front output to collect a laser beam portion for feeding the laser wavelength stabilization loop.

FIG. 5 shows a phase noise reduced laser source module according to a second non-restrictive illustrative embodiment of the present invention. The laser source illustrated in FIG. 5 is very similar to the laser source illustrated in FIG. 2 and described hereinabove. Accordingly only the differences between these two laser sources will be described herein. The main difference between the two laser sources is that the laser 110A of FIG. 5 has only one output. Accordingly, the laser signal supplied to the phase stabilization loop is a small portion of the laser's output collected by using a fiber tap coupler 150, preferably a PM based tap coupler.

Figure 6:
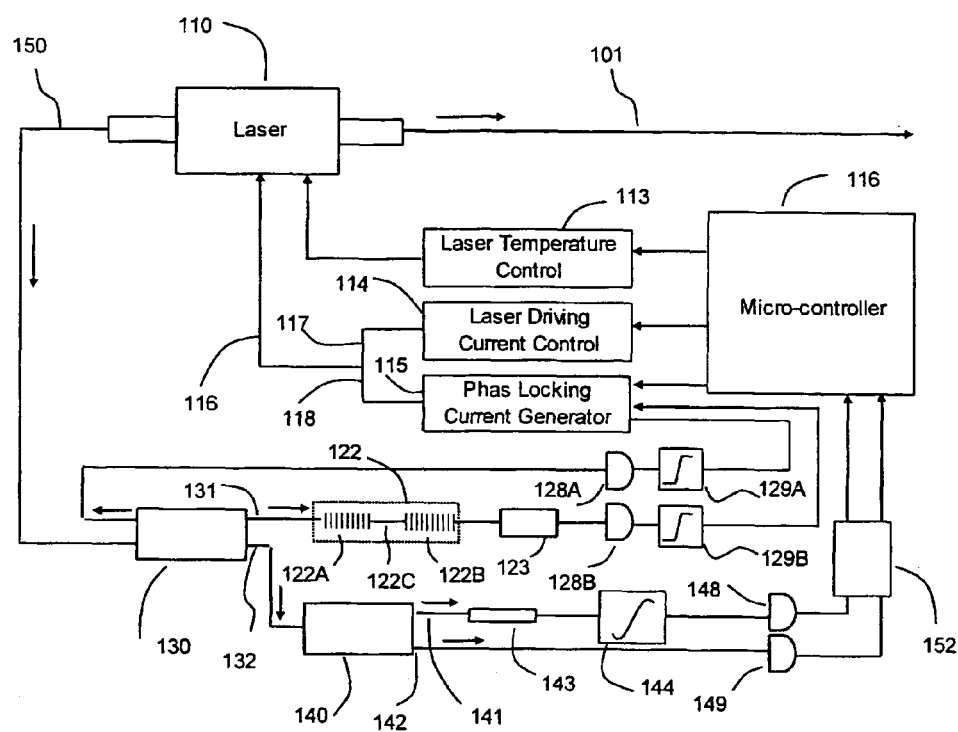
FIG. 6 is another alternative design integrating a second edge-filter and two additional photodetectors for setting and tuning the laser operating wavelength.

FIG. 6 shows a phase noise reduced laser source module according to a third non-restrictive illustrative embodiment of the present invention. Again, the laser source illustrated in FIG. 6 is very similar to the laser source illustrated in FIG. 2 and described hereinabove. Accordingly only the differences between these two laser sources will be described herein.

The 3-port circulator 121 of the embodiment of FIG. 2 is replaced by a 2×2 fiber coupler 130, thereby providing a supplemental port 132. The supplemental port 132 of the coupler 130 is followed by a 1×2 fiber coupler 140. One output port 141 of fiber coupler 140 is connected to a large bandwidth wavelength discrimination filter 144 which covers the laser wavelength tuning range, then projected to a photodiode 148. An isolator 143 is provided between the port 141 and the filter 144 to prevent eventual back reflection light from the large bandwidth wavelength filter 144 from reaching the photodiode 148. The other output port 142 of the coupler 140 is directly connected to another photodiode 149. The signals from the photodiodes 148 and 149 are supplied to the micro-controller 116 through an electronic circuit, for example a differential amplifier circuit 152, and then used for several purposes. More specifically, the signals from the photodiodes 148 and 149 are used to set the laser's initial operating wavelength through the laser driving current control circuit 114 and laser temperature control circuit 113 and to monitor the laser output power. These signals are also used to measure the laser wavelength when the laser driving current control circuit 114 and laser temperature control circuit 113 are used to tune the laser wavelength.

In accordance with the above description, the present invention discloses a technique to stabilize laser wavelength and to reduce laser phase noise by locking the wavelength to a reference wavelength by controlling in real time the current passing through laser diode. The reference wavelength is realized, for example, by an in-line all fiber Fabry-Perot cavity with small FSR and high contrast. Such a filter allows the power detected by photodiodes to be extremely sensitive to input wavelength changes. In addition, the Fabry-Perot cavity filter is loosely packaged inside a small dimension metal body, so that its optical performance will not be affected by acoustic and mechanical vibration.

The present invention further discloses a method and device to control the current passing through the laser diode based on the signals supplied by the wavelength drift detection loop. The small correction current is added directly to the main driving current feeding the laser diode. This technique allows fine tuning of the current for stabilizing the laser wavelength, to therefore reduce the laser phase noise level.

Although the present invention has been described in terms of a non-restrictive illustrative embodiment, it is to be understood that such disclosure is not to be interpreted as limitative. Various alternatives and modifications will no doubt become apparent to those skilled in the art upon reading the above disclosure.

What is claimed is:

1. A device for reducing a phase noise of a laser signal from a laser source, the device comprising:
    a first current generator for supplying a main driving current to the laser source for producing the laser signal;
    a phase noise detector responsive to the laser signal for generating a phase error signal; and
    a second current generator responsive to the phase error signal for generating a compensation current added to the main driving current supplied to the laser source for generating a phase-adjusted laser signal;
    wherein:
    the phase noise detector and the second current generator form a phase stabilization loop for reducing the phase noise of the laser signal;
    the phase noise detector comprises a wavelength drifting detector including (a) a wavelength discrimination filter supplied with the laser signal; the wavelength discrimination filter being so configured as to reflect a portion of the laser signal and to transmit a portion of the laser signal; (b) a first photodetector so connected to the wavelength discrimination filter as to measure the transmitted portion of the laser signal; and (c) a second photodetector so connected to the wavelength discrimination filter as to measure the reflected portion of the laser signal; wherein the ratio of the measured transmitted and reflected laser signal portions is laser wavelength dependent and is usable for detecting wavelength drifting of the laser signal; and the wavelength discrimination filter comprises a Fabry-Perot filter housed in a groove made in a solid metal body and the groove comprises means for preventing tension from being exerted on the Fabry-Perot filter; the size of the body being such that low frequency vibrations are not effectively transferred to the filter.

2. A device as defined in claim 1, wherein the laser source has front and rear outputs and wherein the phase noise detector is connected to the rear output of the laser source.

3. A device as defined in claim 1, wherein the laser source comprises a laser signal output and wherein the phase noise detector is supplied with a portion of the laser signal from the laser signal output.

4. A device as defined in claim 1, wherein the laser source comprises a fiber Bragg grating based external cavity laser for generating the laser signal.

5. A device as defined in claim 1, wherein the measurements of the transmitted and reflected laser signal wavelength portions are intensity variation measurements.

6. A device as defined in claim 5, further comprising a comparator of the intensity variation measurements of the transmitted and reflected laser signal portions in order to generate the phase error signal.

7. A device as defined in claim 1, wherein the wavelength discrimination filter is a periodic high slope wavelength discrimination filter.

8. A device as defined in claim 7, wherein the periodic high slope wavelength discrimination filter comprises a fiber coupler based asymmetric Michelson interferometer.

9. A device as defined in claim 1, wherein the Fabry-Perot filter is made of two Bragg gratings spaced apart by a gap and formed inside an optical fiber.

10. A device as defined in claim 9, wherein the Fabry-Perot filter has a free spectral range and a contrast.

11. A device as defined in claim 1, wherein the second current generator is a laser wavelength locking current generator.

12. A method for reducing a phase noise of a laser signal from a laser source, the method comprising:
    generating through a first current generator a main driving current to be supplied to the laser source for producing the laser signal;
    detecting a phase noise in the laser signal;
    generating a phase error signal in response to the detected phase noise; and
    generating, in response to the phase error signal and through a second current generator, a compensation current to be added to the main driving current supplied to the laser source in view of producing a phase-adjusted laser signal;
    wherein:
    the operations of detecting the phase noise in the laser signal, generating the phase error signal in response to the detected phase noise and generating the compensation current in response to the error signal define a phase stabilization loop for reducing the phase noise of the laser signal;
    detecting a phase noise in the laser signal comprises detecting a wavelength drifting of the laser signal; detecting the wavelength drifting of the laser signal includes (a) supplying the laser signal to a wavelength discrimination filter so configured as to reflect a portion of the laser signal and to transmit a portion of the laser signal; (b) measuring through a first photodetector connected to the wavelength discrimination filter the transmitted portion of the laser signal; and (c) measuring through a second photodetector connected to the wavelength discrimination filter the reflected portion of the laser signal; wherein the ratio of the measured transmitted and reflected laser signal portions is laser wavelength dependent and is usable for detecting wavelength drifting of the laser signal; and
    using as the wavelength discrimination filter a Fabry-Perot filter housed in a groove made in a solid metal body and, in the groove, preventing tension from being exerted on the Fabry-Perot filter; the size of the body being such that low frequency vibrations are not effectively transferred to the filter.

13. A method as defined in claim 12, wherein the measurements of the transmitted and reflected laser signal wavelength portions are intensity variation measurements, and wherein the method comprises comparing the intensity variation measurements with a laser signal reference intensity.

14. A detector for detecting wavelength drifting of a laser signal, comprising:
- a wavelength discrimination filter supplied with the laser signal; the wavelength discrimination filter being so configured as to reflect a portion of the laser signal and to transmit a portion of the laser signal;
- a first photodetector connected to the wavelength discrimination filter for measuring the transmitted portion of the laser signal; and
- a second photodetector connected to the wavelength discrimination filter for measuring the reflected portion of the laser signal;
- wherein the wavelength discrimination filter is a periodic high slope wavelength discrimination filter, the periodic high slope wavelength discrimination filter is a Fabry-Perot filter and the Fabry-Perot filter is made of two Bragg gratings spaced apart by a gap and formed inside an optical fiber; and
- wherein measurements of the transmitted and the reflected laser signal portions are usable for detecting the wavelength drifting of the laser signal.

15. A detector as defined in claim 14, wherein the wavelength discrimination filter comprises a Fabry-Perot cavity.

16. A detector as defined in claim 14, wherein the Fabry-Perot filter has a free spectral range and a contrast.

* * * * *